United States Patent [19]

Sekihara et al.

[11] Patent Number: 4,733,188
[45] Date of Patent: Mar. 22, 1988

[54] NMR IMAGING METHOD

[75] Inventors: Kensuke Sekihara, Mountain View, Calif.; Shigeru Matsui, Koganei; Hideki Kohno, Tokyo, both of Japan

[73] Assignee: Hitachi, Ltd., Tokyo, Japan

[21] Appl. No.: 850,113

[22] Filed: Apr. 10, 1986

[30] Foreign Application Priority Data

Apr. 10, 1985 [JP] Japan ................................. 60-74226

[51] Int. Cl.$^4$ ........................................... G01R 33/20
[52] U.S. Cl. .................................. 324/312; 324/309
[58] Field of Search ............... 324/300, 307, 309, 312; 128/653

[56] References Cited

U.S. PATENT DOCUMENTS

| | | | |
|---|---|---|---|
| 4,509,015 | 4/1985 | Ordidge et al. ...................... | 324/307 |
| 4,588,948 | 5/1986 | Mansfield ............................ | 324/309 |
| 4,689,568 | 8/1987 | Matsui et al. ....................... | 324/309 |
| 4,691,162 | 9/1987 | Van Uijen ........................... | 324/309 |

*Primary Examiner*—Stewart J. Levy
*Assistant Examiner*—Louis M. Arana
*Attorney, Agent, or Firm*—Antonelli, Terry & Wands

[57] ABSTRACT

In imaging methods represented by the echo-planar method, i.e., in a method including a step of measuring the spin echos while applying a fixed gradient magnetic field to an object and applying a gradient field $G_Y$ periodically inverted in sense to the object and a step of obtaining the spin distribution image in the spatial domain by applying two-dimensional Fourier transform to the measured data, measurement is repeated a plurality of times while altering the phase of the applied waveform of $G_X$, and the spin density image is derived by applying two-dimensional Fourier transform to a plurality of sets of data groups thus obtained.

8 Claims, 17 Drawing Figures

NMR IMAGING METHOD

BACKGROUND OF THE INVENTION

The present invention relates to a method for nondestructively determining the nuclear spin distribution and the relaxation time distribution in an object by using the nuclear magnetic resonance, and in particular to a method for measuring these distributions at high speed.

A known method for determining the nuclear spin distribution in an object at high speed is the so-called echo-planar method described in Journal of Magnetic Resonance, 29, pp. 355–373, 1978 in detail. This method includes exciting the nuclear spins, applying a fixed field gradient to the spins in a direction, applying in a direction perpendicular to the above described direction a field gradient periodically inverted in sense, and measuring the nuclear spin signals while field gradients are applied to the object. Since the two-dimensional spin distribution is obtained by the measurement after one excitation attempt, the echo-planar method advantageously has a very short measurement time. However, the echo-planar method has a drawback that a gradient magnetic field having a large amplitude must be changed over at high speed to obtain an image having a quality of practical use.

In the chemical shift imaging method described in U.S. Patent Application "High Speed Imaging Method by Three-dimensional NMR" by the present inventors (filed on June 20, 1980), inversion of the gradient magnetic field similar to that of the echo-planar method is used. Accordingly, the chemical shift imaging method also has the above described problem.

SUMMARY OF THE INVENTION

An object of the present invention is to provide an NMR imaging method capable of providing images of high quality.

Another object of the present invention is to provide an NMR imaging method whereby the production conditions of the inverting gradient magnetic field in the echo-planar method can be relaxed.

A feature of the present invention is that the condition of high-speed changeover of a gradient magnetic field having a large amplitude is relaxed by deriving data for a sectional image from a plurality of measurements.

That is to say, an NMR imaging method according to the present invention includes placing an object in a static magnetic field, exciting the nuclear spins of the object and measuring nuclear spin signals supplied from the object while producing a first gradient magnetic field for applying a field gradient to the static magnetic field in a predetermined direction and producing a second gradient magnetic field for applying another field gradient periodically inverted in sense to the static magnetic field in a direction perpendicular to the direction of the first gradient magnetic field application, repeating the above described measurement a plurality of times while changing the phase whereat the second gradient magnetic field is inverted, and deriving the spin distribution by applying two-dimensional Fourier transform to the data obtained by a plurality of times of measurement.

DESCRIPTION OF THE PREFERRED EMBODIMENTS

Prior to description of embodiments of the present invention, imaging using the conventional echo-planar method will now be described by referring to FIGS. 1 and 2.

Figure 1:
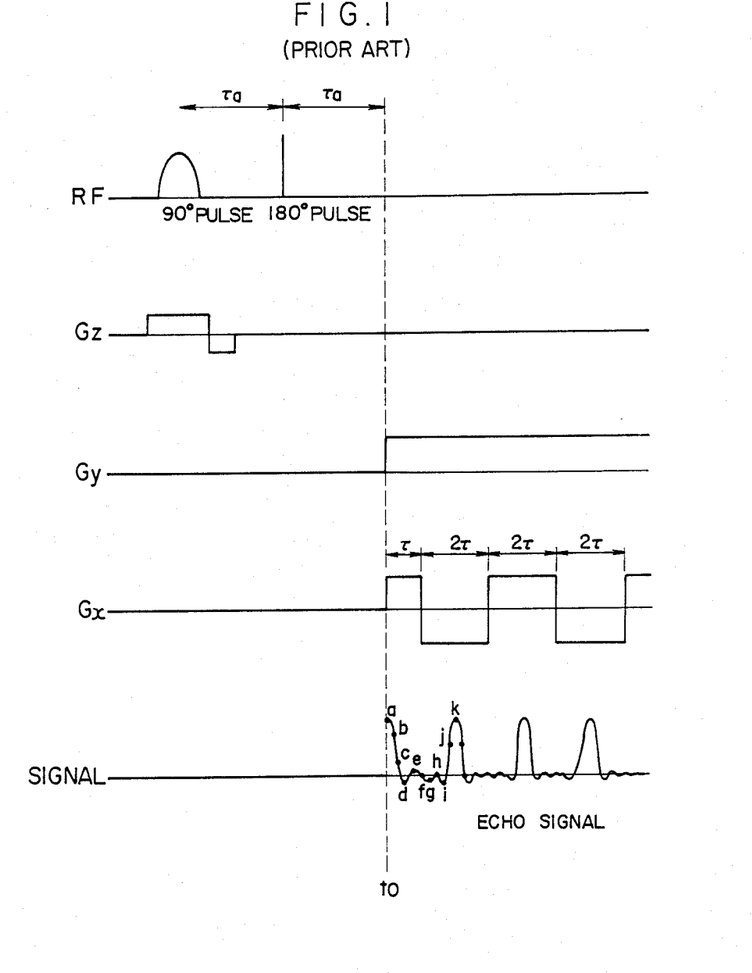
FIGS. 1 and 2 show an example of a measurement sequence of the prior art and a locus of the resultant data points on the Fourier domain, respectively.

FIG. 1 is a sequence diagram for illustrating application timing of RF pulses and gradient magnetic fields when a section of the object perpendicular to the Z axis is selected and measured. In addition to the RF pulse and the gradient magnetic field, a uniform static magnetic field is applied to the object. At first, a gradient magnetic field $G_Z$ for causing a field gradient along the Z direction is applied to the object, and a 90° RF pulse is simultaneously applied to the object. As a result, the nuclear spins within the slice perpendicular to the Z axis are excited. When time $\tau_a$ has elapsed from the peak of the 90° RF pulse, the nuclear spins are inverted by a 180° RF pulse. From time to whereat the time $\tau_a$ has elapsed again, the spin echos are measured for a fixed period. During the measurement period, a fixed gradient magnetic field $G_Y$ to cause a field gradient along the Y direction is applied to the object, and a vibrating gradient magnetic field $G_X$ to cause a field gradient periodically inverted in sense along the X direction is also applied to the object.

Figure 2:
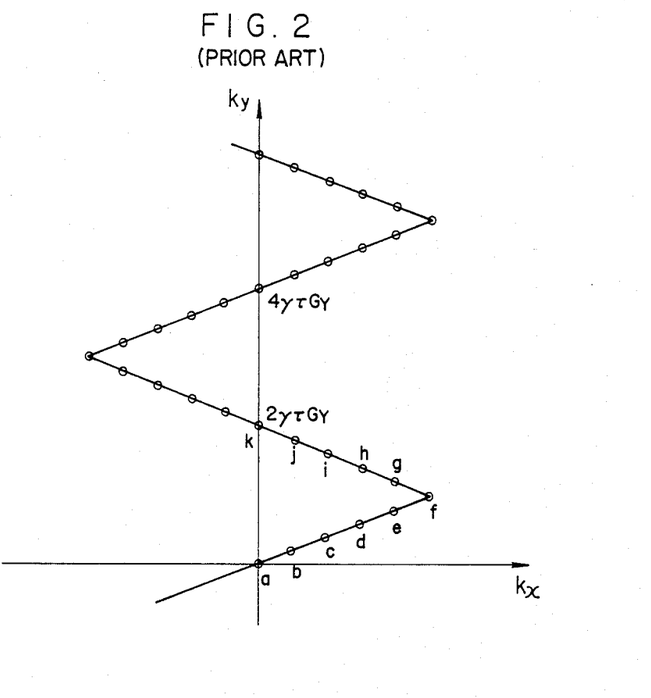

Data points (a, b, c, d, e, f, g, h, i, j, k, of FIG. 1) of measurement data successively sampled in the above described measurement sequence are located on zigzag broken lines in the Fourier domain (phase domain) of the spin density distribution of the object as illustrated in FIG. 2. In FIG. 2, $k_X$ and $k_Y$ denote angular frequency coordinates in the Fourier domain of the nuclear spin distribution. Therefore, the spin density distribution of the object in the spatial domain (X, Y) can be obtained by applying two-dimensional Fourier transform to these data.

Assuming that one repetition period of the vibrating gradient magnetic field is $4\tau$, the field of view in the Y direction is defined by the data interval $4\tau\gamma G_Y$ of the Fourier domain in the $K_Y$ direction. The maximum range of the field of view in the Y direction can be represented as $$L_Y = \frac{\pi}{2\tau\gamma G_Y} \tag{1}$$

That is to say, the angular frequency $\omega_X$ of the vibrating gradient magnetic field can be represented as $$\omega_X = \gamma G_Y L_Y \tag{2}$$

The spatial resolution in the X direction can be represented as $$\text{Resolution } a\omega_X/(\gamma G_X) \quad (3)$$

The gradient magnetic field $G_Y$ must be defined to be sufficiently large as compared to the nonuniformity of the magnetic field. The lower limit value of $G_Y$ is supposed to be approximately 0.03 G/cm. The maximum range of field of view $L_Y$ must be at least approximately 15 cm. Accordingly, the frequency of the vibrating gradient magnetic field $G_X$ represented as $\nu_X = \omega_X/(2\pi)$ is 2 kHz. In order to obtain the resolution of 3 mm in the X direction at this time, $G_X$ must be 0.5 G/cm. It is relatively difficult to drive the gradient magnetic field of 0.5 G/cm at 2 kHz by actual driving apparatus.

The present invention is directed to reduce the data interval of the Fourier domain in the $K_Y$ direction by using a plurality of series of data which are similar to the zigzag line and different from that in phase.

An example of the case where four series of data are used to reduce the data interval in the Y direction to ¼ is shown in FIGS. 3A to 3D.

Figure 3A:
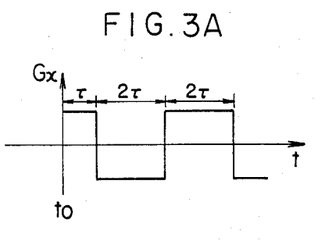
FIGS. 3A to 3E show waveforms of a gradient magnetic field according to the present invention and loci of the resultant data points, respectively.
Figure 3B:
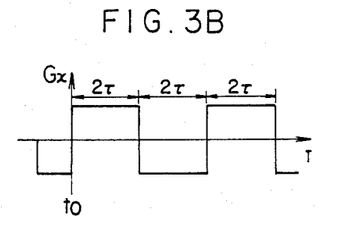
Figure 3C:
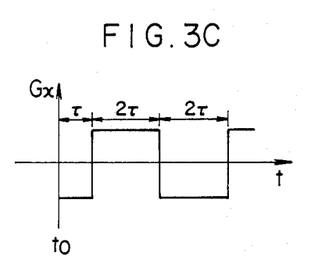
Figure 3D:
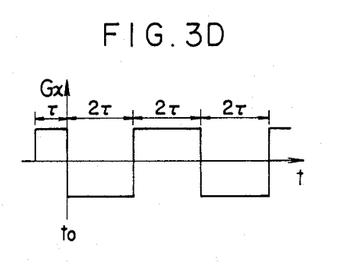

That is to say, data are measured by using a field having a waveform illustrated in FIG. 3A as the vibrating gradient magnetic field $G_X$ in the sequence of FIG. 1. Data are measured again by using a gradient magnetic field $G_X$ having a waveform of FIG. 3B which is delayed in phase by ¼ of the repetition period from the waveform of FIG. 3A. Thereafter, data are measured by successively using $G_X$ having waveforms of FIGS. 3C and 3D. The data measurement is thus repeated four times in total. On the Fourier domain, four series of data thus obtained are arranged on four zigzag lines (a), (b), (c) and (d) of FIG. 3E. When the image is reconstructed from N series of data obtained by applying different $G_X$'s having equally spaced phases, equation (1) is replaced by $$L_Y = N \frac{\pi}{2\tau \gamma G_Y} \quad (4)$$

In the method of the present invention, therefore, the field of view in the Y direction can be expanded to N times at the cost of increase in data measurement time by N times. In order to ensure the same field of view in the Y direction as that of one series of data, the value of $\tau$ can be increased to N times. That is to say, the vibration frequency of $G_X$ can be reduced to 1/N.

An embodiment of the present invention will now be described by referring to drawings.

Figure 4:
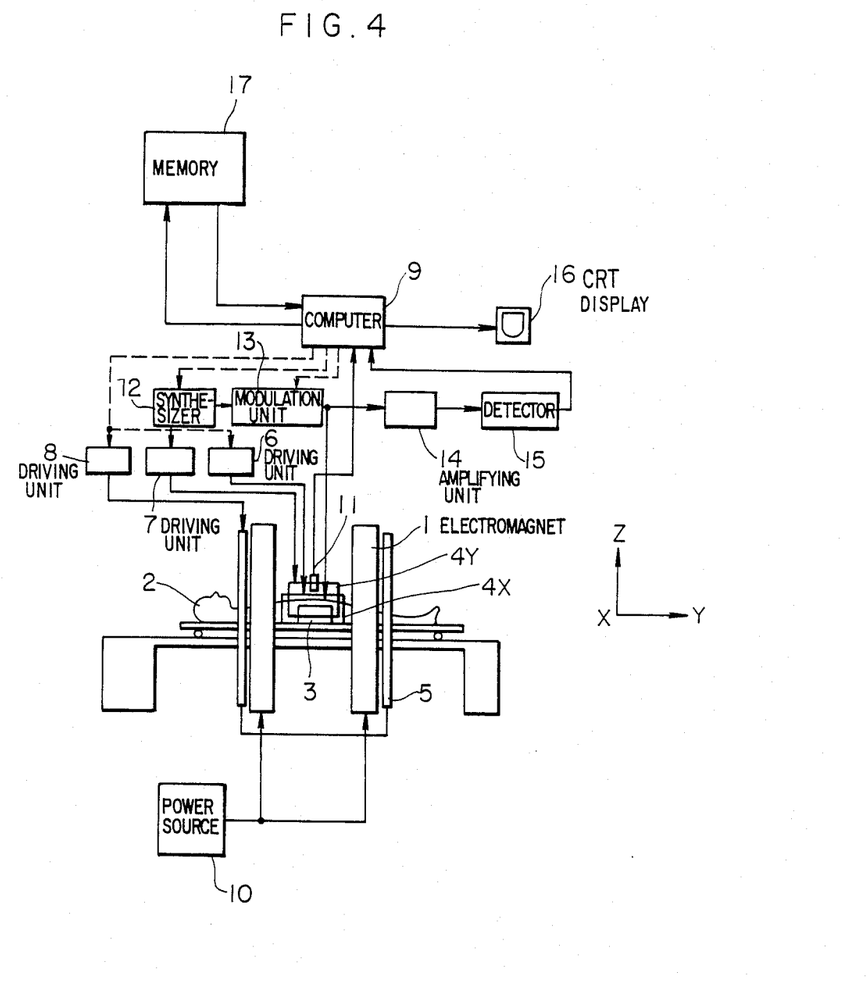
FIG. 4 shows configuraticn of an embodiment of an apparatus according to the present invention.

FIG. 4 is a schematic configuration diagram of an inspection apparatus using nuclear magnetic resonance (hereafter referred to as "inspection apparatus") used for an embodiment of the present invention.

The apparatus of FIG. 4 includes an electromagnet 1 for producing a static magnetic field $H_o$, a coil 3 for producing a high frequency magnetic field and detecting signals produced by the object 2, and gradient magnetic field producing coils 4X, 4Y and 5 for producing the gradient magnetic field in the X, Y and Z directions, respectively. As the gradient magnetic field producing coil 5, circular coils connected so as to let flow currents in directions opposing each other are used. Driving units 6, 7 and 8 supply currents to the gradient magnetic field producing coils 4X, 4Y and 5. The apparatus of FIG. 4 also includes a computer 9, a power source 10 of the electromagnet 1 for producing the static magnetic field, and a capacity measuring unit 11 for measuring the capacity of the object to be inspected. The strength of the gradient magnetic field produced by the gradient magnetic field producing coils 4X, 4Y and 5 can be changed by a command supplied from the measuring unit 11.

The operation of the inspection apparatus will now be described schematically.

The high frequency magnetic field for exciting the nuclear spins in the object 2 is produced by producing the high frequency in a synthesizer 12, applying the waveform shaping and power amplification to the high frequency in a modulation unit 13, and supplying the current to the coil 3. The signals supplied from the object 2 are received by the coil 3 and supplied to a detector 15 through an amplifying unit 14. The signals undergo quadratic detection in the detector 15 and are supplied to the computer 9. After signal processing, the computer 9 displays the image corresponding to the nuclear spin density distribution or the relaxation time distribrution on a CRT display 16. The data appearing on the way of calculation or the final data are stored in a memory 17.

Figure 3E:
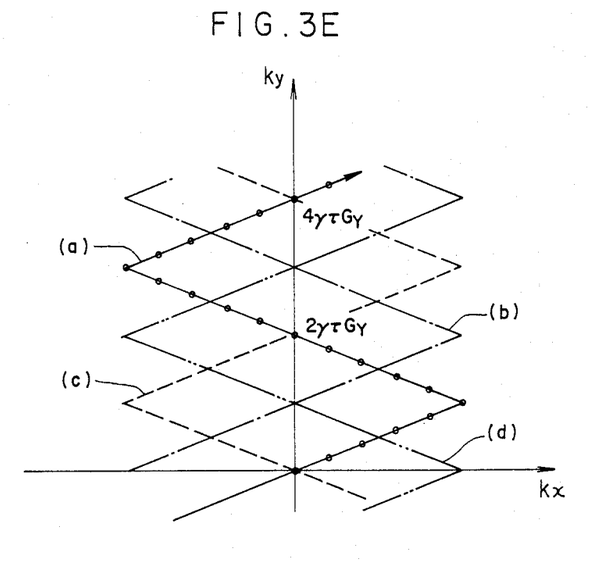
Figure 5A:
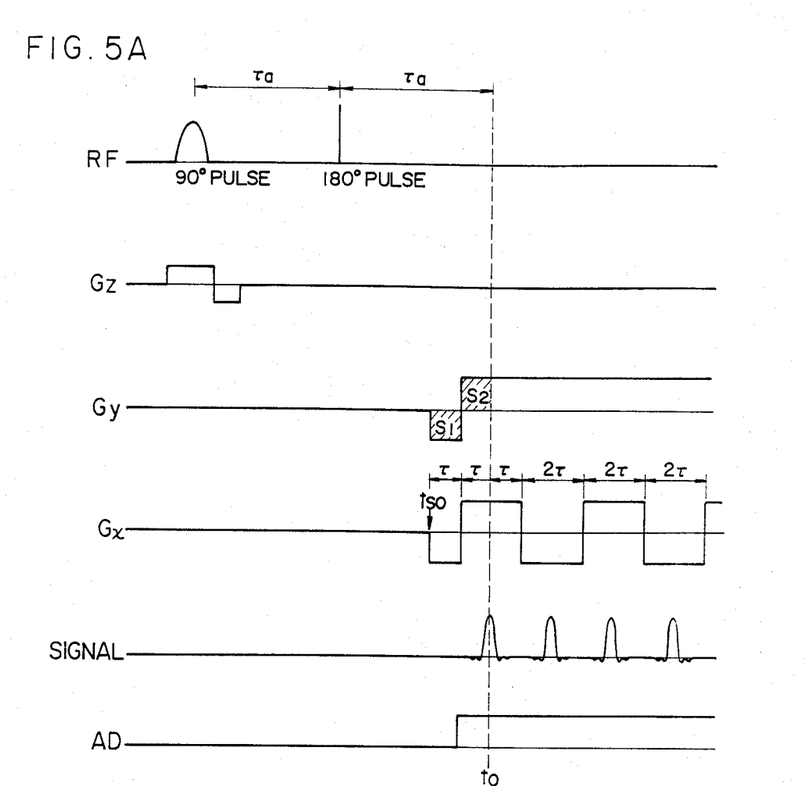
FIGS. 5A to 5D show the measurement sequence of the embodiment.
Figure 5B:
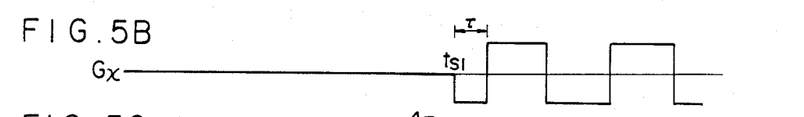
Figure 5C:
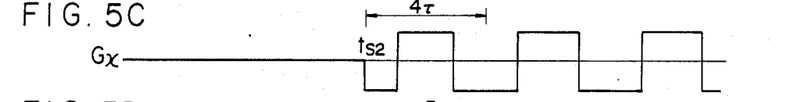
Figure 5D:
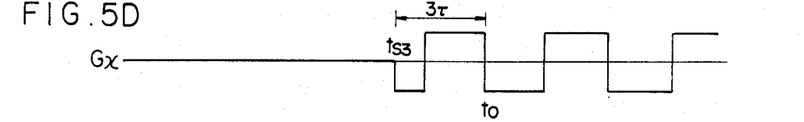

FIGS. 5A to 5D show a measurement sequence of an embodiment of the present invention. In this embodiment, the static magnetic field from the electromagnet 1 is applied to the object placed in the coil. At first, measurement is conducted following the sequence of FIG. 5A. The sequence of FIG. 5 is nearly identical to that of FIG. 1. The nuclear spins in a particular slice of the object are excited by a 90° RF pulse. When $\tau_a$ has elapsed thereafter, the nuclear spins are inverted by a 180° RF pluse. Subsequently, gradient magnetic fields $G_Y$ and $G_X$ are applied to the object and measurement is effected. In this embodiment, however, the signal measurement is conducted in the rising period of the first peak of the spin echo as well. That is to say, application of the gradient magnetic fields $G_Y$ and $G_X$ is started at time $t_{so}$, which procedes the time $t_o$ of the peak of the first echo (the time when $\tau_a$ has elapsed from the 180° RF pulse) by $2\tau$. When $\tau$ has elapsed from $t_{so}$, the field $G_Y$ is inverted in sense and it is maintained at the fixed state thereafter. When $\tau$ has elapsed from $t_{so}$, the field $G_X$ is inverted in sense. Thereafter, the field $G_X$ is inverted in sense at intervals of $2\tau$. That is to say, the repetition period of the application waveform of $G_X$ is $4\tau$. When a required number of data have been sampled by a series of sequences, application of gradient magnetic fields $G_X$ and $G_Y$ is stopped. After the spins within the object have been relaxed, the measurement is effected again. In the second measurement, a waveform illustrated in FIG. 5B is used as the field $G_X$. In the third and fourth measurements, waveforms of FIG. 5C and FIG. 5D are used as the field $G_X$, respectively. A series of data are thus obtained. The waveforms of $G_X$ illustrated in FIGS. 5A, 5B, 5C and 5D are successively delayed in phase by ¼ of the repetition period. In the third measurement, however, application of the field $G_X$ is started at time $t_{s2}$ preceding $t_o$ by $4\tau$ so that the measurement may be begun at time $(t_o - \tau)$. In the fourth measurement, application of the field $G_X$ is started at time $t_{s3}$ preceding $t_o$ by $3\tau$. The data series obtained by the measurement effected four times are located on four equally spaced zigzag lines on the Fourier domain as illustrated in FIG. 3E.

The measurement can be repeated N times (N=2, 3, 5, 6, . . .) instead of 4 times by altering the starting time $t_s$ of application of $G_X$ in each measurement sequence from the position $t_{so}$ illustrated in FIG. 5A so that the relation $t_s^0 - 3\tau \leq t_s \leq t_s^0 + \tau$ may be satisfied. When the first method of image-reconstruction described below is used, the time $t_s$ in each measurement must be equally displaced from that of the previous measurement. When the second method of image-reconstruction is used, however, the time $t_s$ may be nonequally displaced.

The first method for reconstructing the image using the data obtained by applying different $G_X$'s respectively having equally spaced phases N times in total will now be described by referring to FIGS. 6A to 6C.

Figure 6A:
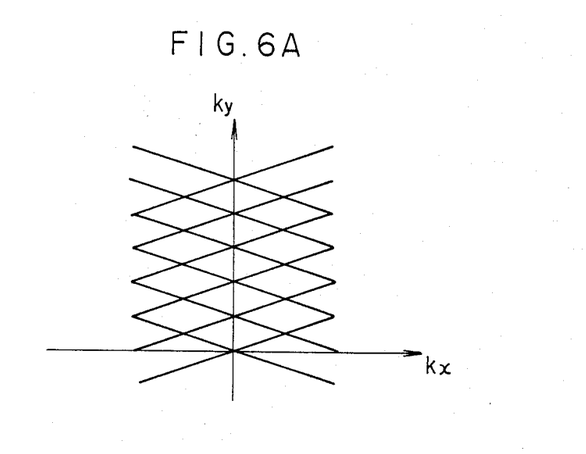
FIGS. 6A to 6C, 7 and 8 show loci of data points used for describing image reconstruction methods of the embodiment.
Figure 6B:
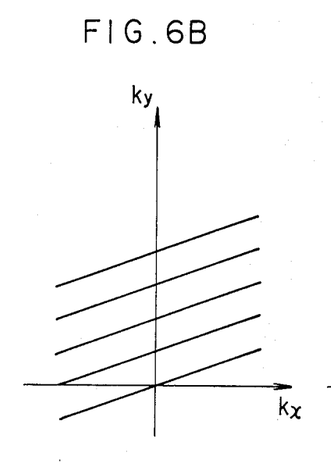
Figure 6C:
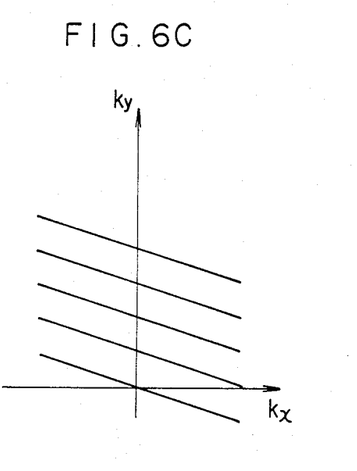

FIG. 6A shows loci of these data when N=4. These data are divided into two groups respectively shown in FIGS. 6B and 6C. FIG. 6B shows the data group obtained while $G_X$ represented as $G_X > 0$ is applied. FIG. 6C shows the data group obtained while $G_X$ represented as $G_X < 0$ is applied. If $t_X$ and $t_Y$ are respectively defined as $k_X = \gamma G_X t_X$ and $k_Y = \gamma G_Y t_Y$, the data group $F_1(t_X, t_Y)$ shown in FIG. 6B can be related to the spin density distribution $\rho(X, Y)$ in the real space $(X, Y)$ as $$F_1(t_X, t_Y) = \int \rho(X, Y) \exp[i\gamma\{(XG_X + YG_Y)t_X + YG_Y t_Y\}] dX dY \quad (5)$$

Therefore, the image $S_1(X', Y')$ obtained by applying two-dimensional Fourier transform to $F_1(t_X, t_Y)$ can be represented as $$S_1(X', X') = \rho(X, Y) \quad (6)$$

$$X' = X + \frac{G_Y}{G_X} Y \quad (7)$$

$$Y' = Y$$

That is to say, the original spin distribution $\rho(X, Y)$ is subjected to distortion represented by equation (7), resulting in $S_1$. The data group $F_2(t_X, t_Y)$ shown in FIG. 6C can be similarly represented as $$F_2(t_X, t_Y) = \int \rho(X, Y) \exp[i\gamma\{(-XG_X + YG_Y)t_X + YG_Y t_Y\}] dX dY \quad (8)$$

The image $S_2(X', Y')$ obtained by applying two-dimensional Fourier transform to $F_2(t_X, t_Y)$ can be represented as $$S_2(X', Y') = \rho(X, Y) \quad (9)$$

$$X' = -X + \frac{G_Y}{G_X} Y \quad (10)$$

$$Y' = Y$$

Accordingly, the final image is obtained as the sum of $S_1(X, Y)$ with distortion compensated by equation (7) and $S_2(X, Y)$ with distortion compensated by equation (10).

Since the actual image is supplied on discrete points, the distortion is compensated as follows.

Assuming that the widths of the picture element in the X direction and in the Y direction are respectively $\Delta X$ and $\Delta Y$, the spin density at a point $(I, J)$ is reproduced as an image at $(g, J)$, where $$g = I + \frac{G_Y \Delta Y}{G_X \Delta X} J \quad (11)$$

Assuming that $[A]$ represents the largest integer not exceeding A, we let $$I' = [g]$$

$$\eta = I' - [g] \quad (12)$$

The image with the distortion compensated is derived by $$S_1^R(I, J) = (1 - \eta) S_1(I', J) + \eta S_1(I' + 1, J) \quad (13)$$

Following the similar procedure, the image with the distortion compensated $S_2^R(I, J)$ is derived from $S_2(I, J)$. And the final image $S(I, J)$ is derived as $$S(I, J) = S_1^R(I, J) + S_2^R(I, J) \quad (14)$$

The compensation of image distortion caused by the nonuniformity of the static magnetic field can be included in the above described image reconstruction calculation as follows.

Assuming the magnetic field map in the field of view is $E(X, Y)$, equations (7) and (10) can be rewritten as $$X' = X + \frac{1}{G_X}(G_Y Y + E(X, Y)) \quad (7)'$$

$$Y' = Y + \frac{1}{G_Y} E(X, Y)$$

and $$X' = -X + \frac{1}{G_X}(G_Y Y + E(X, Y)) \quad (10)'$$

$$Y' = Y + \frac{1}{G_Y} E(X, Y)$$

And equations (11), (12) and (13) are respectively rewritten as $$g = I + \frac{1}{G_X \Delta X \Delta}(G_Y \cdot \Delta Y J + E(I, J)) \quad (11)'$$

$$h = J + \frac{1}{\Delta Y} E(I, J)$$

$$I' = [g] \quad (12)'$$

$$\eta_1 = g - I'$$

$$J' = [h]$$

$$\eta_2 = h - J'$$

$$S_1^R(I, J) = (1 - \eta_1)(1 - \eta_2) S_1(I', J') + \quad (14)'$$
$$(1 - \eta_1)\eta_2 S_1(I', J' + 1) +$$
$$\eta_1(1 - \eta_2) S_1(I' + 1, J') +$$
$$\eta_1 \eta_2 S_1(I' + 1, J' + 1)$$

Several methods for conveniently measuring the magnetic field map $E(I, J)$ have been proposed. For example, $S_1^R(I, J)$ is derived by using the measured $E(I, J)$ and equations (11)', (12)' and (14)' in the above described image reconstruction method. Following the similar procedure, $S_2^R(I, J)$ is derived. Thus, an image with the influence of the nonuniformity of the magnetic field removed can be obtained by deriving S(I, J) using equation (14).

The method for reconstructing the image from data groups measured by the present technique has heretofore been described. However, there is also a second image reconstruction method, which will now be described.

Figure 7:
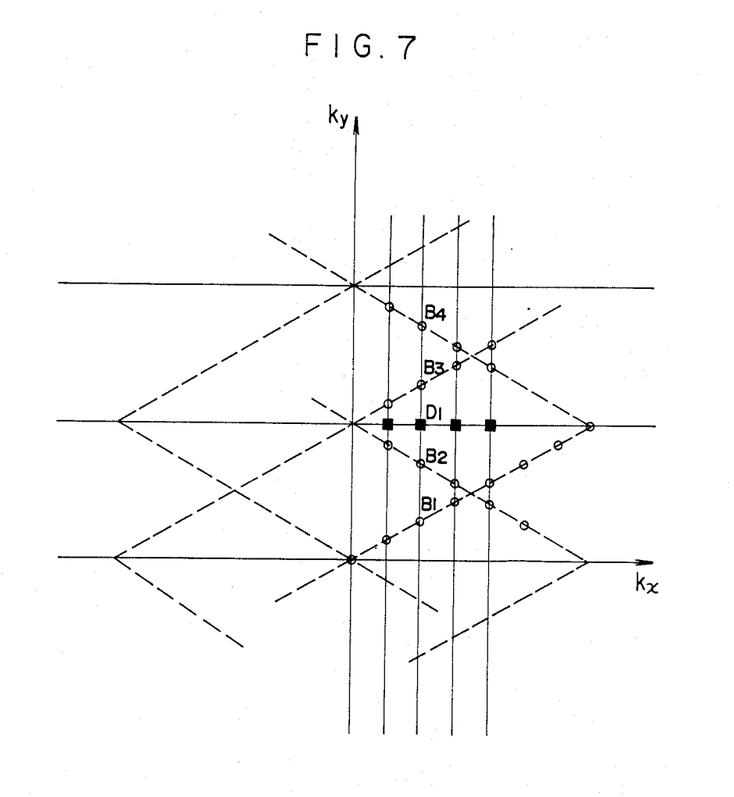

In the second method, the data of orthogonal coordinate points on the phase domain are estimated from the data groups on the zigzag points by interpolation. In FIG. 7, loci of the measured data groups are represented by dotted lines, and orthogonal coordinate points are represented by solid lines. And some of measured data points are represented by circles, and examples of orthogonal coordinate points are represented by quadrangles. In the present method, the orthogonal coordinate points are estimated from the measured points having the same $k_X$ value by interpolation. That is to say, data on a point $D_1$ of FIG. 7 is estimated from data on points $B_2$ and $B_3$ having the point $D_I$ between them as $$D_1 = \frac{\xi_3 B_2 + \xi_2 B_3}{\xi_2 + \xi_3},$$

where $\xi_2$ and $\xi_3$ are the distance between points $D_1$ and $B_2$ and the distance between points $D_1$ and $B_3$ on the phase domain, respectively. If four points $B_1$, $B_2$, $B_3$ and $B_4$ are used for interpolation, $D_I$ can be estimated with higher precision. By applying two-dimensional Fourier transform to the values on the orthogonal coordinate points thus obtained, the spin density distribution $\rho(X, Y)$ on the real space domain can be derived. The nonuniformity of the magnetic field also exerts influence upon the image obtained by this algorithm, resulting in the image distortion in the Y direction. Therefore, the distortion can be compensated by equation $$y' = y + \frac{1}{G_Y \Delta_y} E(X, Y)$$

In this image reconstruction method, there is a possibility of error occurrence when the orthogonal coordinate points are estimated. When $G_X$ can be driven by an accurate rectangular waveform, therefore, the first method in which the oblique coordinate points are Fourier-transformed is desirable.

In fact, it is difficult to drive the gradient magnetic field with an accurate rectangular waveform. A method of driving the gradient magnetic field with sine waves has been proposed for carrying out the echo-planar method. The loci of data points in case of sine wave drive are represented by solid lines in FIG. 8.

Figure 8:
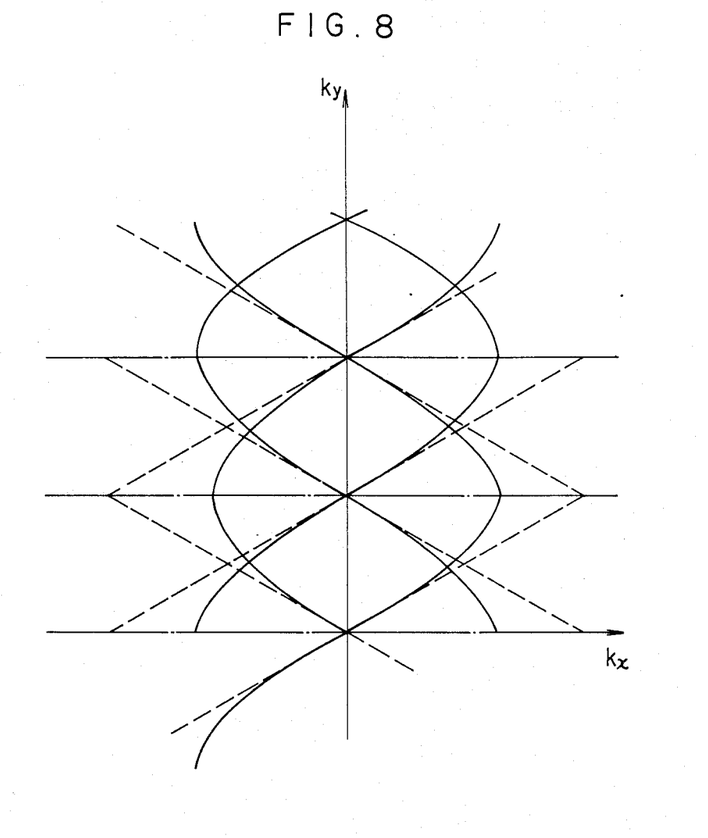

In such a case, it is necessary to estimated the data on the orthogonal coordinates (dotted lines of FIG. 8) or the data on the oblique coordinates (broken lines of FIG. 8) from the data groups arranged on the sine wave by using the interpolation. For this estimation, two-dimensional interpolation in the phase domain is required. The two-dimensional interpolation can be avoided by making the AD conversion timing, i.e., the signal sampling timing nonequally spaced as $$t_m = \frac{1}{\omega_X} \arccos\left(\frac{m \Delta k_X}{G_X}\right),$$

for example, where $\Delta k_X$ is the width on the $k_X$ axis. This method of estimating the data on the orthogonal coordinate points or the oblique coordinate in the Fourier domain can be applied to an arbitrary $G_X$ drive waveform. This method can also be applied to the case where the waveform phase of $G_X$ is nonequally displaced.

By using the method of the present invention in which the measurement is repeated while the waveform phase of the inverting gradient magnetic field is altered, it is possible to obtain the image with a lower speed inversion of gradient field, which is equivalent to the image obtained by prior methods with the inversion of the gradient magnetic field at high speed. Therefore, the present invention can be applied not only to the imaging method using the echo-planar method as illustrated in the embodiment but also to other methods using periodically inverting a gradient magnetic field. For example, it is possible to obtain spin density images in slices distinguished for respective chemical shifts by using a sequence in which the space between the 90° RF pulse and the 180° RF pulse of FIG. 5A is made different from the space between the 180° RF pulse and the peak of the spin echo on the basis of the chemical shift of the resonance frequency of the nuclear spins contained in the object. In this case as well, measurement is repeated while $G_X$ is altered as shown in FIGS. 5B to 5D.

We claim:

1. An NMR imaging method for obtaining a spin distribution image of a certain region of an object placed in a static magnetic field, including steps of;
   (a) exciting nuclear spins in said region of said object,
   (b) inverting the sense of said nuclear spins by a 180° RF pulse in order to generate a spin echo,
   (c) applying a first fixed gradient magnetic field along a first direction and a second gradient magnetic field periodically inverted in sense in a second direction perpendicular to the first direction to said object in order to generate a train of spin echoes,
   (d) sampling spins signals of said train of spin echoes in order to obtain a data group,
   (e) repeating the steps of (a)–(d) in order to obtain a plurality of data groups with the phase of the wave form of said second gradient magnetic field remaining constant in each repetition and said phase being altered in the successive repetitions, and
   (f) reconstructing the spin distribution image by applying two-dimensional Fourier transform to said plurality of data groups.

2. An NMR imaging method according to claim 1, wherein the phase of said second gradient magnetic field is altered to be equally spaced in the successive repetitions.

3. An NMR imaging method according to claim 1, wherein the phase of said second gradient magnetic field is altered to be nonequally spaced in the successive repetitions.

4. An NMR imaging method according to claim 1, wherein said reconstruction step includes:
   deriving first spin distribution data of the real space domain by applying two-dimensional Fourier transform to data groups measured while said second gradient magnetic field assumes a first sense;

deriving second spin distribution data on the real space domain by applying two-dimensional Fourier transform to data groups measured while said second gradient magnetic field assumes a second sense which is opposite to said first sense; and adding data including in said first data spin distribution to corresponding data included in said second spin distribution data.

5. An NMR imaging method according to claim 1, wherein said reconstruction step includes:

estimating data arranged on orthogonal coordinates of the phase domain by applying interpolation to a plurality of data arranged on oblique lines of the phase domain, said plurality of data being obtained by said repetition of measurement; and calculating data on the real space domain by applying two-dimensional Fourier transform to the estimated data.

6. An NMR imaging method according to claim 1, wherein said second gradient magnetic field is inverted in a rectangular form.

7. An NMR imaging method according to claim 1, wherein said second gradient magnetic field is inverted in a sine wave form.

8. An NMR imaging method according to claim 7, wherein sampling of said spin signals is conducted at nonequal intervals according to the waveform of said second gradient magnetic field.

* * * * *